United States Patent
Peng et al.

(10) Patent No.: US 6,957,119 B2
(45) Date of Patent: Oct. 18, 2005

(54) METHOD FOR MONITORING MATCHED MACHINE OVERLAY

(75) Inventors: Tsung-Han Peng, Hsinchu (TW); Ding-Chien Chien, Hsinchu (TW); Chung-Hsin Liu, Hsinchu (TW); Chih-Chia Hsu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 245 days.

(21) Appl. No.: 10/237,082

(22) Filed: Sep. 9, 2002

(65) Prior Publication Data

US 2004/0049762 A1 Mar. 11, 2004

(51) Int. Cl.[7] .............................................. G06F 19/00
(52) U.S. Cl. ..................... 700/121; 700/124; 355/27; 355/53; 382/144; 716/21
(58) Field of Search ........................... 716/21; 700/121, 700/125, 124; 382/144, 145; 438/14, 402

(56) References Cited

U.S. PATENT DOCUMENTS

| | | | |
|---|---|---|---|
| 5,877,036 A | * 3/1999 | Kawai | 438/16 |
| 5,939,226 A | 8/1999 | Tomimatu | |
| 5,989,761 A | 11/1999 | Kawakubo et al. | |
| 6,077,756 A | * 6/2000 | Lin et al. | 438/401 |
| 6,165,656 A | 12/2000 | Tomimatu | |
| 6,166,801 A | * 12/2000 | Dishon et al. | 355/27 |
| 6,190,928 B1 | * 2/2001 | Lo et al. | 438/14 |
| 6,309,944 B1 | * 10/2001 | Sheng et al. | 438/401 |
| 6,535,774 B1 | * 3/2003 | Bode et al. | 700/109 |
| 6,684,122 B1 | * 1/2004 | Christian et al. | 700/121 |
| 6,697,698 B2 | * 2/2004 | Yoshitake et al. | 700/124 |
| 6,741,903 B1 | * 5/2004 | Bode et al. | 700/121 |
| 2002/0140917 A1 | * 10/2002 | McArthur et al. | 355/53 |
| 2004/0015256 A1 | * 1/2004 | Conrad et al. | 700/121 |

OTHER PUBLICATIONS

Bornebroek F., et al., Overlay Performance in Advanced Processes, pp. 1–8.

* cited by examiner

*Primary Examiner*—S. A. Whitmore
(74) *Attorney, Agent, or Firm*—Akin Gump Strauss Hauer & Feld, LLP

(57) ABSTRACT

A method for monitoring overlay alignment on a wafer that includes identifying a target machine, identifying a target process, identifying a plurality of critical layers, obtaining a plurality of overlay data from at least one of designated registration patterns on the wafer as baseline data, providing a plurality of reference overlay data, correlating the plurality of the reference overlay data with the baseline data to obtain overlay error, comparing the overlay error with specifications of the target machine, accepting the baseline data when the overlay error is within the specifications, and performing overlay alignment monitoring with the baseline data.

15 Claims, 1 Drawing Sheet

METHOD FOR MONITORING MATCHED MACHINE OVERLAY

DESCRIPTION OF THE INVENTION

1. Field of the Invention

This invention relates in general to a semiconductor manufacturing process and, more particularly, to a method for monitoring the accuracy of overlay alignment during photolithographic steps.

2. Background of the Invention

In semiconductor manufacturing process where a plurality of integrated circuits ("ICs") are manufactured on a silicon wafer, a number of layers of semiconductor materials with various patterns of circuit layouts are overlaid on top of one another at predetermined locations. A machine known as a "stepper" is used at various stages of the manufacturing process to transfer circuit layout patterns onto a layer by exposing a photoresist to ultraviolet light through a mask, or reticle. The circuit layout pattern is transferred through the reticle onto a photoresist in a step and repeat manner. The reticle is moved at a predetermined distance at a time, and the photoresist is exposed to the pattern and developed. The movement of the reticle is repeated for all of the ICs that are to be formed on the wafer.

The overlay accuracy greatly affects the critical dimensions, characteristics, and performance of the ICs, and the yield of wafer production. As a result, a number of overlay alignment techniques have been employed in the semiconductor manufacturing process, such as single machine overlay, matched machine overlay, and process-induced overlay. With the exception of the process-induced overlay, the single machine and matched machine overlays both incorporate a "pattern alignment" technique that primarily uses registration patterns to determine overlay accuracy. The registration patterns are generally squares of different sizes. In essence, a plurality of registration patterns are provided on the reticle. The marks, together with circuit layouts, are transferred onto a designated layer through photolithography. During the lithographic process of the reticle pattern of a subsequent layer, the stepper will locate, or recognize, the marks of a previous layer, and align the marks of an upper layer against a lower layer.

The registration patterns may be configured for a "box-in-box," or "bar-to-bar," type target where the first-to-second layer overlay may be determined using a metrology tool. In addition, overlay data, or systematic parameters, of the first-to-second layer overlay may be obtained. Overlay data include translation (a shift in the X and/or Y direction), rotation, and scaling (or magnification) between the first and second layers. Therefore, the overlay data are used to ascertain the accuracy of the overlay, and are also known as wafer alignment data. Deviations of the measured overlay data from the baseline, or ideal, overlay parameters are known as overlay errors.

To ensure the accuracy of overlay alignment, stepper manufacturers have provided various methods to evaluate their photolithographic exposure tools. For example, ASM International, N.V., provides a "Machine Matching Test" for some of the steppers that it sells. In the Machine Matching Test, a control wafer including already-etched first-layer marks is provided. A second layer of photoresist is provided over the control wafer. After the second layer of photoresist is exposed to ultraviolet light and developed. The measurement between the first and second layers is performed in the same stepper on the control wafer. The overlay systematic parameters between the first and second layers are measured. These parameters are used as data models. The measurement process is repeated for approximately 201 marks per field on the control wafer. The entire process generally requires about 30 to 90 minutes to complete, during which time the stepper must be taken off-line from the manufacturing process of a semiconductor fab. In addition, the relative accuracy of the Test is uncertain as the machine used to do the Test is itself used to manufacture the wafers.

Therefore, there remains a need for a quick, efficient, and accurate method to evaluate overlay alignment.

SUMMARY OF THE INVENTION

In accordance with the invention, there is provided a method for monitoring overlay alignment on a wafer that includes identifying a target machine, identifying a target process, identifying a plurality of critical layers, obtaining a plurality of overlay data from at least one of designated registration patterns on the wafer as baseline data, providing a plurality of reference overlay data, correlating the plurality of the reference overlay data with the baseline data to obtain overlay error, comparing the overlay error with specifications of the target machine, accepting the baseline data when the overlay error is within the specifications, and performing overlay alignment monitoring with the baseline data.

Also in accordance with the invention, there is provided a method for monitoring overlay alignment on a wafer that includes identifying a target machine, identifying a target process, identifying a plurality of critical layers, obtaining a plurality of overlay data from a plurality of designated registration patterns on the wafer as baseline data, correlating a plurality of the reference overlay data with the baseline data to obtain overlay error, accepting the baseline data when the overlay error is within specifications of the target machine, and performing overlay alignment monitoring with the baseline data.

It is to be understood that both the foregoing general description and the following detailed description are exemplary and explanatory only and are not restrictive of the invention, as claimed.

The accompanying drawing, which is incorporated in and constitutes a part of this specification, illustrates an embodiment of the invention and together with the description, serves to explain the principles of the invention.

DESCRIPTION OF THE EMBODIMENTS

Figure 1:
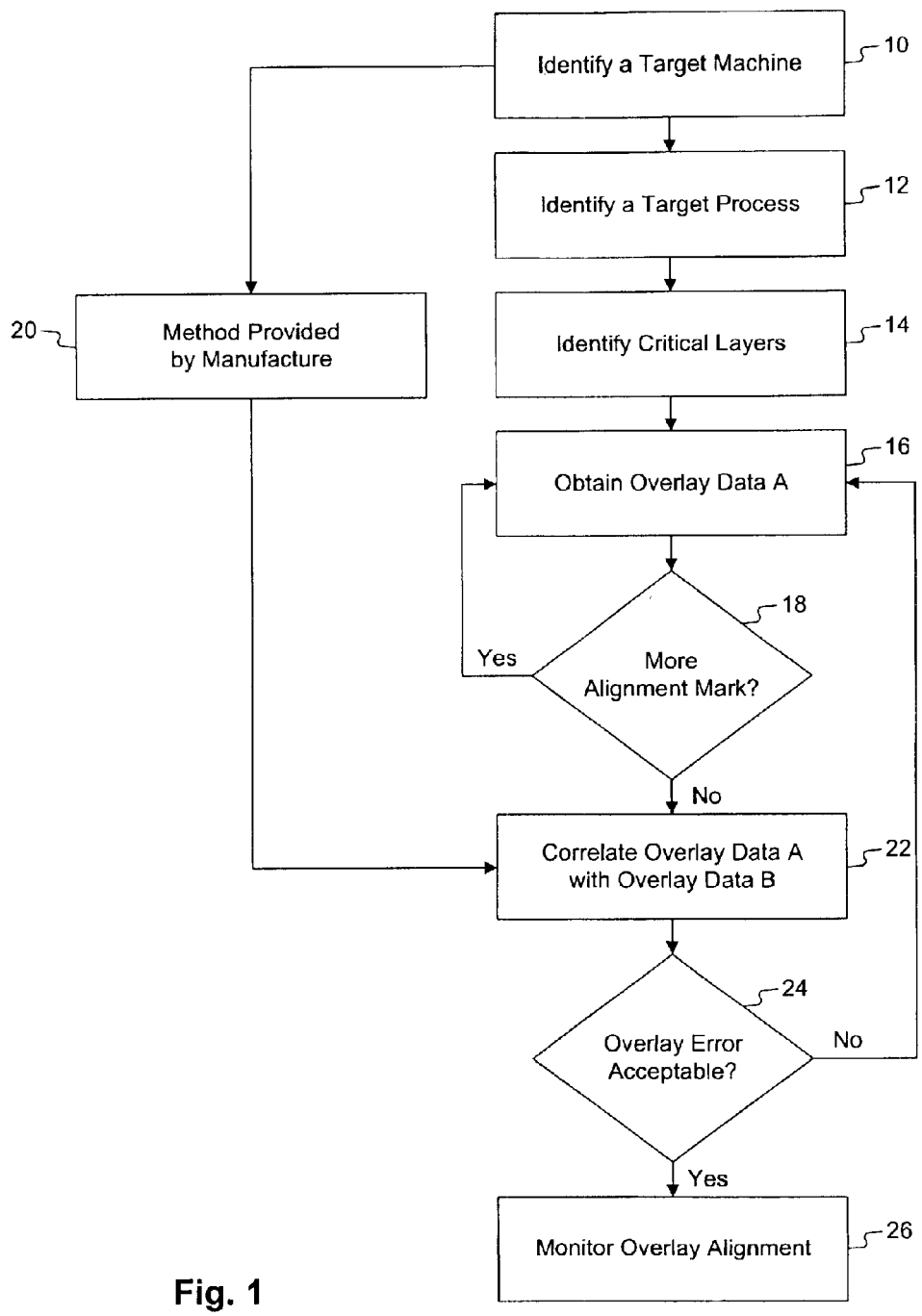
FIG. 1 is a flow chart consistent with one embodiment of the method of the present invention.

Reference will now be made in detail to the exemplary embodiments of the invention, an example of which is illustrated in the accompanying drawing. Wherever possible, the same reference numbers will be used throughout the drawings to refer to the same or like parts.

The present invention provides a Monitor System to improve and replace the conventional methods, such as the Machine Match Test, to monitor overlay alignment. The Monitor System of the present invention requires as few as five registration patterns to monitor overlay alignment. Because only small number of registration patterns are used to measure overlay data, the down-time of the stepper is greatly decreased. In addition, the Monitor System of the present invention improves upon the accuracy and reliability of conventional alignment monitor methods because the baseline overlay data used to monitor overlay alignment need not come from the same stepper.

FIG. 1 is a flow chart showing one embodiment consistent with the Monitor System of the present invention. Referring to FIG. 1, a target machine is first identified at step 10. The target machine may be chosen from one of many steppers used to perform the same function within a manufacturing process. A target machine should preferably be the most accurate of all of the steppers. The accuracy of a stepper may be defined as having the best yield, or the tightest factory specifications. Data collected from the target machine will be used as the baseline overlay data for the method of the present invention.

A target process is identified at step 12. The target process may be chosen among all of the manufacturing processes available at a semiconductor fab. The target process may be chosen from the process for a product line having the most stringent product specifications, which, in many cases, is the most advanced process having the smallest critical dimensions.

After a target process is identified at step 12, critical layers are identified at step 14 to obtain the overlay data of the Monitor System of the present invention. The critical layer may be chosen from a layer having the most impact on the critical dimensions of the process or most difficult in overlay alignment. For example, the critical layer may be chosen from the formation of shallow trench isolations, field oxide isolations, or metal and interconnect layers. After the critical layers are identified, the overlay data are obtained at step 16 as the baseline overlay data for the method of the present invention. To obtain the overlay data, a first layer of photoresist is provided over a critical layer identified at step 14. After the first layer of photoresist is exposed to ultraviolet light, developed and etched, a second photolithographic process is performed. The overlay data between the first registration patterns on the first critical layer and the second registration patterns on the second critical layer are measured. These overlay data are designated as "Overlay Data A". The measurement process is repeated at step 18 for all of the designated registration patterns. The registration patterns are preferably chosen from different locations on the wafer. In one embodiment, five registration patterns are designated, one at the center of the wafer, and the other four at four corners of the wafer spaced substantially equally from one another.

Referring again to step 10, a conventional method to monitor overlay alignment provided by the manufacturer of the target machine, one such as the Machine Match Test, is performed at step 20 to obtain overlay data. These data are designated as "Overlay Data B". In the case of the Machine Matching Test, a control wafer including already-etched registration patterns is provided. A first layer of photoresist is provided over the control wafer. After the first layer of photoresist is exposed to ultraviolet light, developed, and etched, a second photolithographic process is performed in the same stepper. The overlay data between the first and second registration patterns are measured. The measurement process is repeated for all of the registration patterns throughout the control wafer.

The Overlay Data B and Overlay Data A are correlated at step 22. The correlation of these two sets of data indicates the overlay error, or basic offset, of the Monitor System of the present invention. The overlay error is verified at step 24 by comparing the overlay error with the specifications of the target machine. If the overlay error is within the specifications, the Overlay Data A are used as the baseline data for the method of the present invention. The Monitor System of the present invention may be used to monitor overlay alignment at step 26 without having to refer, obtain, or correlate the Monitor System with conventional overlay alignment monitoring methods, such as the Machine Matching Test, provided by the manufacturers of steppers.

If, however, the overlay error as verified at step 24 is outside the specifications of the target machine, steps 16, 18, 22 and 24 are repeated until the overlay error falls within the specifications. The corresponding Overlay Data A thus obtain may be then used as the baseline data for the method of the present invention to monitor overlay alignment.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for monitoring overlay alignment on a wafer, comprising:

identifying a target machine;

identifying a target process;

identifying a plurality of critical layers;

obtaining a plurality of overlay data from at least one of designated registration patterns on the wafer as baseline data;

providing a plurality of reference overlay data;

correlating the plurality of the reference overlay data with the baseline data to obtain overlay error;

comparing the overlay error with specifications of the target machine;

accepting the baseline data when the overlay error is within the specifications; and performing overlay alignment monitoring with the baseline data, where providing a plurality of reference overlay data comprise:

providing a control wafer including first layers with already-etched registration patterns;

performing a second photolithographic process;

obtaining the reference overlay data between the first and second photolithographic processes; and repeating the step of obtaining the reference overlay data for all of a plurality of registration patterns provided on the control wafer.

2. The method as claimed in claim 1, further comprising, rejecting the baseline data when the overlay error is outside the specifications;

repeating the step of obtaining a plurality of overlay data from at least one of designated registration patterns on the wafer to obtain a different set of baseline data;

correlating the different set of baseline data to the reference overlay data to obtain a different overlay error; and comparing the different overlay error with the specifications of the target machine.

3. The method as claimed in claim 1, wherein the target machine is identified from a plurality of machines with a best yield among the plurality of machines.

4. The method as claimed in claim 1, wherein the target process is chosen from a plurality of processes with smallest critical dimensions.

5. The method as claimed in claim 1, wherein the plurality of critical layers comprise layers for a formation of shallow trench isolations.

6. The method as claimed in claim 1, wherein the plurality of critical layers comprise layers for a formation of field oxide isolations.

7. The method as claimed in claim 1, wherein the plurality of critical layers comprise layers for a formation of metal and interconnect layers.

8. The method as claimed in claim 1, wherein the plurality of critical layers comprise a polysilicon layer.

9. The method as claimed in claim 1, wherein the step of obtaining a plurality of overlay data comprises:

providing a first layer of photoresist over a first of the plurality of critical layers;

providing a first photolithographic process on the first layer of photoresist;

providing a second photolithographic process on a second of the plurality of critical layers; and obtaining the plurality of overlay data.

10. The method as claimed in claim 1, wherein there are at least five designated registration patterns.

11. The method as claimed in claim 1, further comprising:

rejecting the baseline data when the overlay error is outside the specifications; and repeating the step of obtaining a plurality of overlay data from the plurality of designated registration patterns on the wafer to obtain a different set of baseline data until a different overlay error that is within the specifications of the target machine is obtain.

12. The method as claimed in claim 1, wherein the target machine is identified from a plurality of machines with a best yield among the plurality of machines.

13. The method as claimed in claim 1, wherein the target process is chosen from a plurality of processes with smallest critical dimensions.

14. The method as claimed in claim 1, where one of the designated registration patterns is located at the center of the wafer, and four of the designated registration patterns are located at four corners of the wafer spaced substantially equally from center to designated field.

15. A method for monitoring overlay alignment on a wafer, comprising:

identifying a target machine;

identifying a target process;

identifying a plurality of critical layers;

obtaining a plurality of overlay data from all of designated registration patterns as baseline data;

providing a plurality of reference overlay data;

correlating the plurality of the reference overlay data with the baseline data to obtain overlay error;

comparing the overlay error with specifications of the target machine;

accepting the baseline data when the overlay error is within the specifications;

performing overlay alignment monitoring with the baseline data, where one of the designated registration patterns is located at the center of the wafer, and the others are located at four corners of the wafer spaced substantially equally from one another.

* * * * *